(12) United States Patent
Roy et al.

(10) Patent No.: US 7,993,796 B2
(45) Date of Patent: Aug. 9, 2011

(54) WAFER PROVIDED WITH TRANSVERSE CONDUCTORS AND APPLICATION TO A FUEL CELL

(75) Inventors: Mathieu Roy, Joue les Tours (FR); Fabien Pierre, Saint Cyr sur Loire (FR)

(73) Assignee: STMicroelectronics SA, Montrouge (FR)

( * ) Notice: Subject to any disclaimer, the term of this patent is extended or adjusted under 35 U.S.C. 154(b) by 1328 days.

(21) Appl. No.: 11/317,436

(22) Filed: Dec. 22, 2005

(65) Prior Publication Data

US 2006/0141339 A1    Jun. 29, 2006

(30) Foreign Application Priority Data

Dec. 24, 2004   (FR) .................................... 04 53228

(51) Int. Cl.
H01M 8/04 (2006.01)
H01M 8/08 (2006.01)
H01M 4/02 (2006.01)
H01M 4/36 (2006.01)
H01M 4/62 (2006.01)

(52) U.S. Cl. ........ 429/513; 429/498; 429/512; 429/532; 429/535; 428/131; 428/306.6; 428/314.2; 502/101

(58) Field of Classification Search ............... 429/12–46
See application file for complete search history.

(56) References Cited

U.S. PATENT DOCUMENTS

| 6,741,017 | B1 | 5/2004 | Ide et al. |
| 2003/0013372 | A1 | 1/2003 | Uemura et al. |
| 2004/0045816 | A1* | 3/2004 | Masel et al. ............. 204/290.14 |
| 2004/0167014 | A1* | 8/2004 | Yan et al. ...................... 502/101 |
| 2004/0197638 | A1 | 10/2004 | McElrath et al. |
| 2005/0255368 | A1* | 11/2005 | Kaye et al. ...................... 429/38 |

FOREIGN PATENT DOCUMENTS

EP    1339087 A1    8/2003
FR    2 846 797       5/2004

OTHER PUBLICATIONS

Morjan, R., et al., "Selective Growth of Individual Multiwalled Carbon Nanotubes," *Current Applied Physics* 4:591-594, 2004.
Urbán, M., et al., "Production of Multiwall Carbon Nanotubes in the Modified Pore System of Mesoporous Silicates," *Diamond and Related Materials*, 13:1322-1326, 2004.
Yu et al., "Fabrication of a miniature twin-fuel-cell on silicon wafer," *Electrochimica Acta* 48: 1537-1541, 2003.

* cited by examiner

*Primary Examiner* — Dah-Wei D Yuan
*Assistant Examiner* — Steven Scully
(74) *Attorney, Agent, or Firm* — Lisa K. Jorgenson; Hai Han; Seed IP Law Group PLLC

(57) ABSTRACT

A thin wafer comprising through holes filled at least partially with conductive carbon nanotubes generally oriented transversally to the wafer. A fuel cell comprising, in a thin wafer, a through hole filled with an electrolyte surrounded with barriers of carbon nanotubes generally oriented transversally to the wafer.

18 Claims, 3 Drawing Sheets

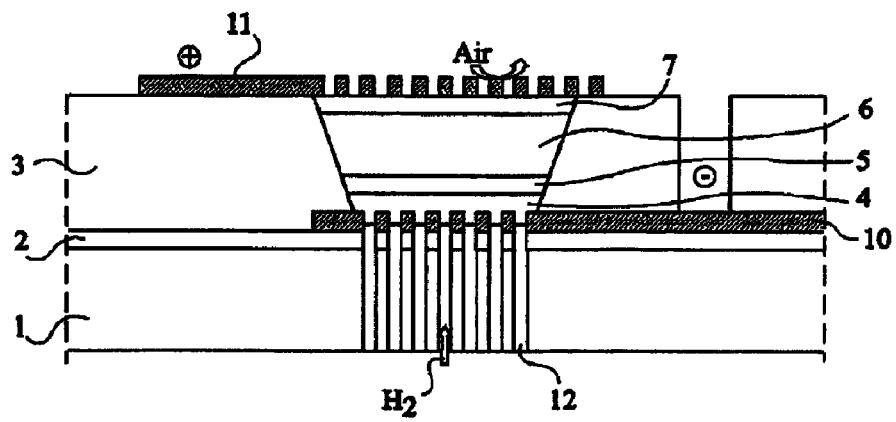
FIG. 1 *(Prior Art)*
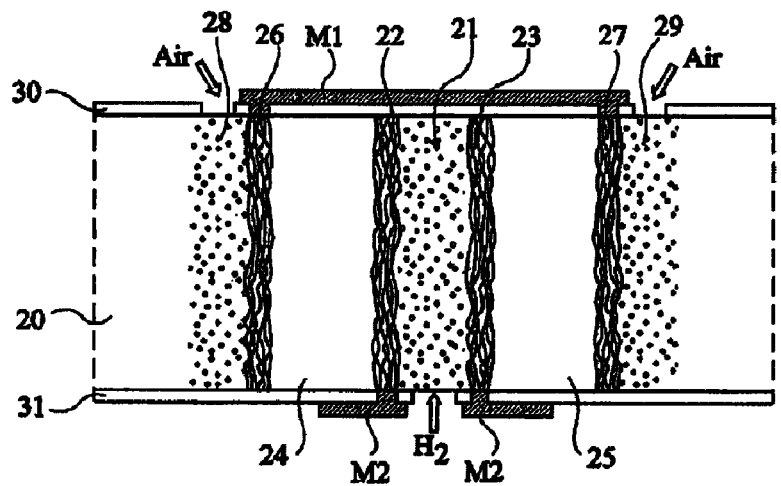
FIG. 2A
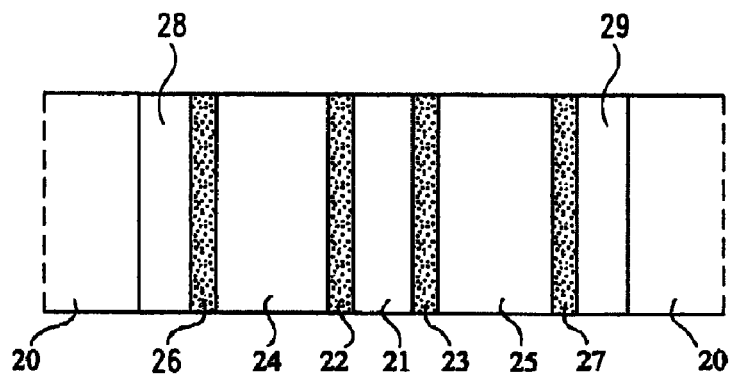
FIG. 2B

WAFER PROVIDED WITH TRANSVERSE CONDUCTORS AND APPLICATION TO A FUEL CELL

BACKGROUND OF THE INVENTION

1. Field of the Invention

The present invention relates to the manufacturing of microcomponents. It more specifically relates to the forming of through vias in microcomponents and to a specific application to the forming of a fuel cell.

2. Description of the Related Art

FIG. 1 shows an example of the forming of a fuel cell using microelectronic techniques. This cell is formed on a silicon wafer 1 coated with a first thin insulating layer 2 and with a second thicker insulating layer 3. An opening is formed in a portion of insulating layer 3. In this opening are successively deposited a support 4, a lower catalyst layer 5, an electrolyte 6, and a upper catalyst layer 7. An electrode 10 enables taking a contact on the lower surface of the cell, more specifically on the catalyst support in the shown example. An upper electrode 11 enables taking a contact on upper catalyst layer 7. Electrodes 10 and 11 are provided with openings, and channels 12 are formed in silicon wafer 1 opposite to the openings in the lower surface metallization.

To operate the fuel cell, hydrogen is injected along arrow $H_2$ on the lower surface side and air (carrying oxygen) is injected on the upper surface side. A hydrogen flow and an air flow may be ensured to have a good contact between the hydrogen and lower catalyst 5 and between the air and upper catalyst 7. In known fashion, with such a structure, a positive voltage is obtained on the upper electrode (on the oxygen side) and a negative voltage is obtained on the lower electrode (on the hydrogen side).

FIG. 1 shows a single fuel cell. In practice, on a same wafer 1, a large number of cells that can be assembled in series/parallel according to the desired use will be formed. Electrolyte 7 for example is a polymeric acid such as solid Nafion and the catalyst layers are for example carbon- and platinum-based layers. This is an example only. Various types of fuel batteries that can be formed as illustrated in FIG. 1 are known in the art.

In such a fuel cell, the power that can be provided is especially proportional to the surface area taken up by the cell in the silicon wafer plane.

BRIEF SUMMARY OF THE INVENTION

In one embodiment, the present invention provides a novel type of fuel cell of greater power per surface area unit than the shown cell and which is simpler to manufacture.

In one embodiment, the present invention provides the forming of conductive channels in a wafer.

In particular, the present invention provides the forming of conductive channels in silicon wafers, for example, for the forming of vias.

In one embodiment, the present invention provides a thin wafer comprising through holes filled at least partially with conductive carbon nanotubes generally oriented transversally to the wafer.

According to an embodiment, the nanotubes are multiple-wall nanotubes.

According to an embodiment, the thin wafer is made of silicon, and an insulating layer is formed between the carbon nanotubes and the walls of the through holes.

The present invention also provides a fuel cell comprising in a thin wafer a through hole filled with an electrolyte surrounded with barriers of carbon nanotubes generally oriented transversally to the wafer.

According to an embodiment, a first gas is injected through a barrier of carbon nanotubes on one side of the electrolyte and a second gas is injected through the nanotube barrier on the other side of the electrolyte.

According to an embodiment, a porous material, such as porous silicon, is arranged on the side of the carbon nanotube barriers opposite to the electrolyte.

The present invention also provides a method for manufacturing a fuel cell, comprising the steps of forming through openings in a silicon wafer; making the silicon porous close to the openings; growing carbon nanotubes from a surface of the wafer towards the opposite surface; and hollowing portions arranged between two carbon nanotube barriers and filling the hollowed portions with an electrolyte.

The foregoing features, and advantages of the present invention will be discussed in detail in the following non-limiting description of specific embodiments in connection with the accompanying drawings.

BRIEF DESCRIPTION OF THE SEVERAL VIEWS OF THE DRAWINGS

FIG. 1 is a simplified cross-section view of a fuel cell according to prior art;

FIG. 2A is a simplified cross-section view of an embodiment of a fuel cell according to the present invention;

FIG. 2B shows an example of a top view of the cell of FIG. 2A; and

DETAILED DESCRIPTION OF THE INVENTION

Figure 3A:
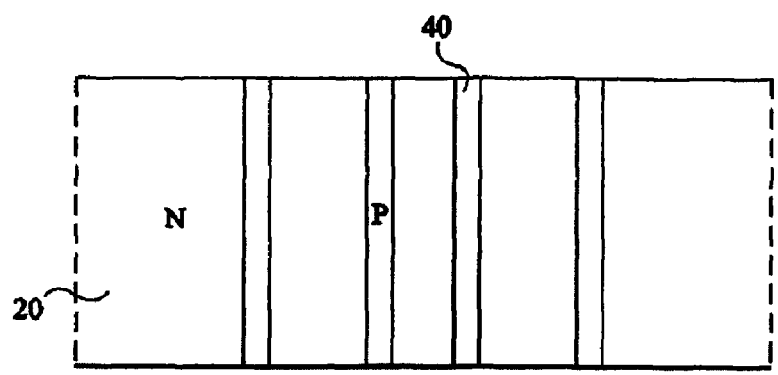
FIGS. 3A to 3F are simplified cross-section views illustrating the successive manufacturing steps of the fuel cell of FIG. 2.

For clarity, same elements have been designated with same reference numerals in the different drawings and, further, as usual in the representation of integrated components, the various drawings are out of scale.

FIG. 2A is a cross-section view of two symmetrical fuel cells according to an embodiment of the present invention. Other cells may be formed by repetition of this elementary pattern. The structure of these cells will be better understood by also referring to the simplified top view of FIG. 2B. A silicon wafer 20 is thoroughly crossed by a porous silicon strip 21 encircled by through vertical barriers of carbon nanotubes 22 and 23, themselves surrounded with electrolyte strips (24, 25) surrounded with carbon nanotube strips 26 and 27, then with porous silicon strips 28 and 29. The carbon nanotubes generally extend in the direction transverse to the silicon wafer and are coated or impregnated with a catalyst such as platinum. The electrolyte for example is Nafion or another polymer acid.

An upper electrode M1 is in contact with the upper portion of the carbon nanotube barriers 26 and 27. A lower electrode M2 is in contact with the lower portion of carbon nanotube barriers 22 and 23. Upper and lower tight insulating layers 30 and 31 are deposited to ensure the necessary insulations. Upper insulating layer 30 comprises openings above the upper portion of porous silicon strips 28 and 29. Lower insulating layer 31 comprises an opening at the level of the lower portion of porous silicon layer 21. In operation, hydrogen is injected on the lower surface side into central porous silicon layer 21 and oxygen (air) is injected on the upper surface side into external porous silicon strips 28, 29. Thus, a potential difference develops across the electrolyte and a voltage is sampled between metallizations M1 and M2 which respectively form the positive terminal and the negative terminal of the fuel cell.

The carbon nanotubes preferably are multiple-wall nanotubes which are well conductive. It should be noted that such carbon nanotubes are used for their double property of electric conduction and of transverse permeability to gases. Indeed, such nanotubes enables the gases to cross them and to come in contact with the electrolyte on either side thereof.

The structure very schematically illustrated in FIGS. 2A and 2B is likely to have many variations which will occur to those skilled in the art as concerns the used materials and the cell topology, the essential features of the application of the present invention to the forming of a fuel cell lying in the vertical direction (transverse to a surface of the wafer) of the contacts and in the use of carbon nanotubes which are used both as conductive elements and as permeable walls.

As an example of an alternative topology, it should be noted that the various structures crossing the wafer, instead of having the shape of parallel strips, may be concentric or have any other desired shape intended to optimize the surface area.

An advantage of the structure with a vertical contact between the electrolyte and the electrodes lies in the possible increase in the power generated per surface area unit. In a conventional structure such as illustrated in FIG. 1, the active surface of an individual cell is limited to the surface area that it takes up in the plane of the wafer in or on which it is formed. Conversely, with a structure according to the present invention, if the wafer thickness is much greater than the width of the contact and electrolyte constitutive layers, an integration density much higher than in prior art may be obtained. This assumption is true in practice for a 400-µm wafer thickness and a repetition step of the base structure (porous silicon-nanotubes-electrolyte-nanotubes-porous silicon) on the order of from 100 to 200 µm.

As alternative materials, still keeping carbon nanotubes, it should be noted that the wafer in which the structure is formed is not necessarily a silicon wafer. It could for example be a glass pane. Further, it is not necessary to use porous silicon as a gas conductor, but any other porous material may be used. Especially, porous silicon portions 28 and 29 may be replaced with a widening of carbon nanotube structures 26 and 27. Similarly, porous silicon 21 may be replaced with a carbon nanotube area.

FIGS. 3A to 3F illustrate an example of a method for manufacturing the structure illustrated in FIGS. 2A and 2B.

Figure 3B:
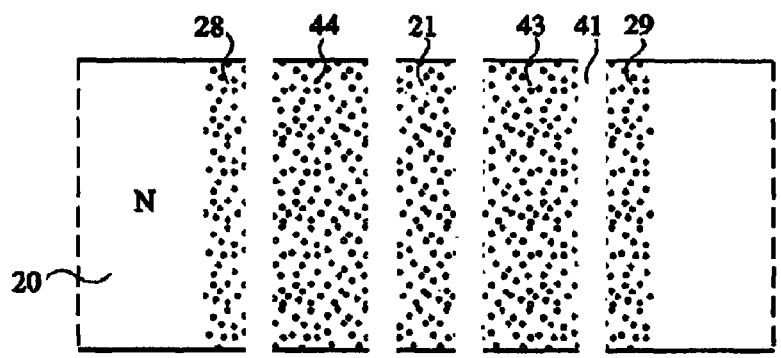

First, through trenches are dug into a silicon wafer 20 at the locations where the carbon nanotube barriers will be arranged. These through trenches may be formed by many known methods. For example, the step sequence illustrated in FIGS. 3A and 3B is carried out. As shown in FIG. 3A, through P-type trenches 40 are first formed in an N-type silicon substrate. The oriented deep diffusion of a P-type dopant may for example be obtained by a so-called TGZM aluminum diffusion caused by temperature gradient (Temperature Gradient Zone Melting). Then, a selective etch of the P-type doped silicon with respect to the N-type silicon is performed to obtain through trenches 41 (FIG. 3B).

After this, the wafer is submitted to an electrolytic processing to turn the areas surrounding the through trenches 41 thus formed into porous silicon. Porous silicon areas 21, 28, 29 described in relation with FIG. 2 and additional areas 43 and 44 surrounding central porous silicon area 21 are thus obtained.

Figure 3C:
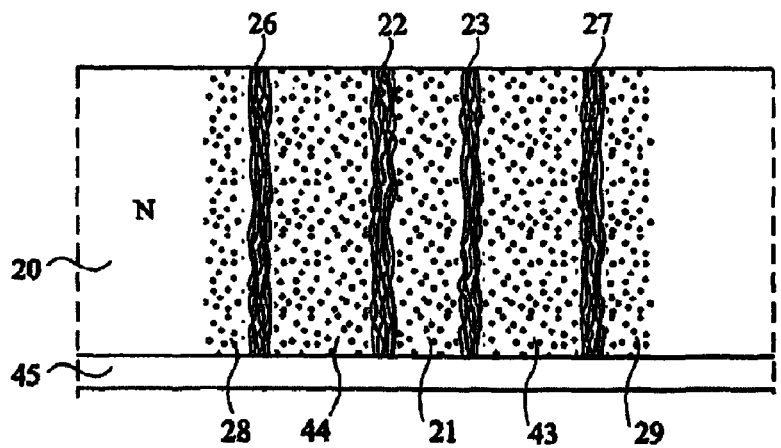

At the step illustrated in FIG. 3C, the wafer is laid on a support 45 for growing carbon nanotubes, and multiple-wall carbon nanotubes 23, 26, and 27 are grown, which fill openings 41 formed in the wafer. The carbon nanotube growth support may for example be a wafer coated with many carbon nanotube growth seeds, for example, based on iron, nickel, and/or cobalt. During or after the carbon nanotube growth, a doping by platinum or any other appropriate catalyst which is used as a catalyst for the reaction between the gases (hydrogen, oxygen) and the electrolyte is performed.

Figure 3D:
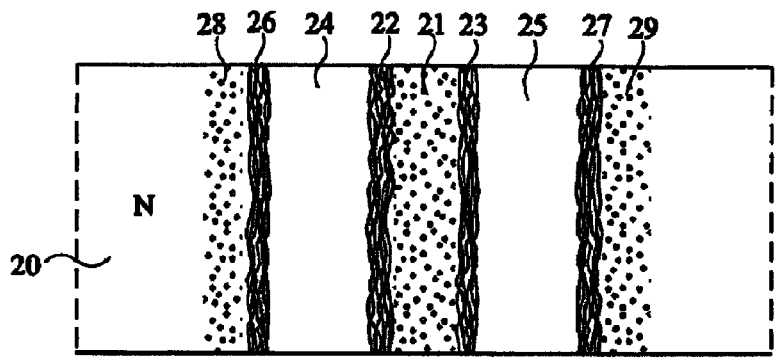

At the step illustrated in FIG. 3D, porous silicon regions 43 and 44 are suppressed by a selective etch method, the portions not to be etched being protected by a mask, and a wet filling with a solid polymer acid such as Nafion is performed. The structure of FIG. 2A has thus been obtained without the upper and lower surface insulations and metallizations.

Figure 3E:
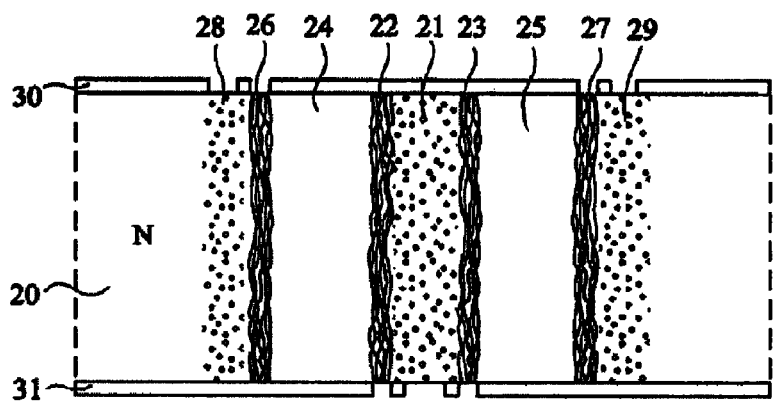
Figure 3F:
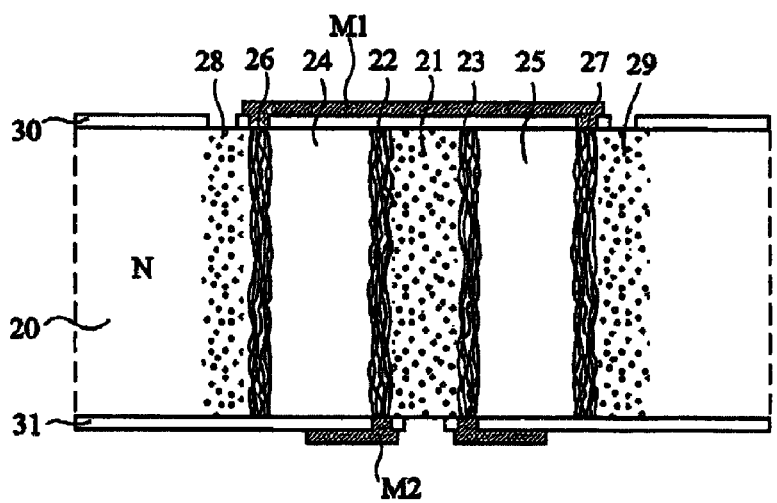

At the step illustrated in FIG. 3E, insulating upper surface and lower surface layers 30 and 31 are deposited and opened as described in relation with FIGS. 2A and 2B. Then, at the step illustrated in FIG. 3F, the deposition and etching of metallizations M1 and M2 is performed also according to the pattern described in relation with FIGS. 2A and 2B.

The present invention has been described hereabove in the context of a specific application to the forming of fuel cells.

In its more general aspect, the present invention provides starting from a wafer made of any material, for example, silicon or glass, boring through openings and growing, from the lower surface, the multiple-wall carbon nanotubes in these openings, to obtain islands or walls of carbon nanotubes extending from the lower surface to the upper surface of a substrate. These islands or walls of carbon nanotubes may be used as in the case of the previously-described fuel cell for their properties of conductivity and of permeability to gases but also, only for their conductive properties to form conductive vias through a wafer. In the case where the wafer is made of glass, this will enable for example taking contacts from the lower surface to electronic components, formed on the upper surface, for example, passive components. In the case where the wafer is a silicon wafer, a local transformation of the silicon into porous silicon, possibly oxidized, may as described previously be performed, or a thermal oxidation of through openings formed in the silicon before the carbon nanotube growth may simply be performed. An advantage of such a use of carbon nanotubes is that, in their longitudinal direction, the carbon nanotubes have an extremely high conductivity, even greater than that that an aluminum mass taking up the same volume would have.

Of course, the present invention is likely to have various, alterations, improvements, and modifications which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A device, comprising:
   a thin wafer having a lower surface, an upper surface, and a plurality of through holes extending in a first direction from the upper surface to the lower surface;
   a porous material extending completely through the wafer and between the first and second through holes of the plurality; and
   conductive carbon nanotubes positioned in the first and second through holes and oriented longitudinally in the first direction, wherein the conductive carbon nanotubes extend completely through the wafer in the first direction and surround the porous material.

2. The device of claim 1, wherein the nanotubes are multiple-wall nanotubes.

3. The device of claim 1, wherein the thin wafer is made of silicon, the device further comprising insulating layers respectively formed between the carbon nanotubes and walls of the first and second through holes.

4. The device of claim 1, further comprising electrolyte strips extending between the upper and lower surfaces and surrounding the porous material and the conductive carbon nanotubes.

5. The device of claim 1 wherein the porous material is porous silicon.

6. The device of claim 1 wherein the thin wafer is silicon or glass.

7. A fuel cell comprising:
   a thin wafer having an upper surface and a lower surface; and
   a through hole extending in a first direction from the upper surface to the lower surface of the thin wafer, said through hole being filled with an electrolyte surrounded with barriers of carbon nanotubes, the carbon nanotubes extending longitudinally in the first direction and transversally to the upper and lower surfaces of the wafer, wherein the barriers of carbon nanotubes extend completely through the thin wafer.

8. The fuel cell of claim 7, further comprising:
   a first opening configured to allow a first gas to be injected through a first one of the barriers of carbon nanotubes on a first side of the electrolyte; and
   a second opening configured to allow a second gas to be injected through a second one of the barriers of carbon nanotubes on second side of the electrolyte.

9. The fuel cell of claim 7, further comprising:
   a first porous region arranged on an opposite side of the first barrier of carbon nanotubes with respect to the electrolyte; and
   a second porous region arranged on an opposite side of the second barrier of carbon nanotubes with respect to the electrolyte.

10. The fuel cell of claim 9 wherein the porous regions comprise porous silicon.

11. A fuel cell comprising:
    a wafer having a top surface and a bottom surface;
    a first through opening in the wafer extending in a first direction from the bottom surface to the top surface, the first through opening being filled with a first plurality of conductive carbon nanotubes arranged longitudinally in the first direction and extending completely through the first through opening,
    a second through opening in the wafer extending from the bottom surface to the top surface, the second through opening being filled with a second plurality of conductive carbon nanotubes arranged longitudinally in the first direction and extending completely through the second through opening, and
    an electrolyte chamber containing an electrolyte and arranged between the first and second through openings.

12. The fuel cell of claim 11 wherein gas can be injected into the first through opening and the second through opening.

13. The fuel cell of claim 11 further comprising:
    a first gas conductor region on a side of the first through opening opposite from the electrolyte chamber; and
    a second gas conductor region on a side of the second through opening opposite from the electrolyte chamber.

14. The fuel cell of claim 13 wherein the first and second gas conductor regions contain a porous material.

15. The fuel cell of claim 14 wherein the porous material is porous silicon.

16. The fuel cell of claim 11 wherein the wafer is silicon or glass.

17. The device of claim 1 further comprising:
    an electrode underlying the lower surface of the thin wafer; and
    an insulator overlying the upper surface of the thin wafer, wherein the insulator contacts the carbon nanotubes of the first through hole and the second through hole, and the electrode contacts the carbon nanotubes of the first through hole and the second through hole.

18. The device of claim 11 further comprising:
    a first electrode and a first insulator underlying the lower surface of the thin wafer; and
    a second electrode and a second insulator overlying the upper surface of the thin wafer, wherein the carbon nanotubes of the first through opening contact the first insulator and the second electrode, and the carbon nanotubes of the second through opening contact the second insulator and the first electrode.

* * * * *